United States Patent [19]

Homan et al.

[11] Patent Number: 4,485,152
[45] Date of Patent: Nov. 27, 1984

[54] SUPERCONDUCTING TYPE II PALLADIUM ALLOY HYDRIDE-PALLADIUM HYDRIDE COMPOSITES

[75] Inventors: Clarke G. Homan, Schenectady; Wilfried W. Scholz, Latham; William J. Standish, Loudonville; Andreas Leiberich, Albany, all of N.Y.

[73] Assignee: Research Foundation, State University of New York, N.Y.

[21] Appl. No.: 389,679

[22] Filed: Jun. 18, 1982

[51] Int. Cl.$^3$ .............................................. H01B 1/00
[52] U.S. Cl. .................................. 428/670; 420/900; 420/901; 420/464; 428/930
[58] Field of Search .............. 420/900, 901, 463, 465; 423/644, 648 R; 428/670, 930

[56] References Cited

U.S. PATENT DOCUMENTS 4,341,846  7/1982  Hough et al. ....................... 428/670

OTHER PUBLICATIONS

Szafranski A. W. et al., "Superconductivity in the $Pd_{1-x}M_xH_c$ (M=Noble Metal) and $PdB_yH_c$ Alloy Systems", Phys. Stat. Sol., 37, pp. K163-164, 1976.
Skoskiewicz, T., Phys. Stat. Sol., 11, p. K123, (1972), b59, p. 329, (1973).
Skoskiewicz, T. et al., J. Phys. C. Sol. St. Phys., 7, p. 2670, (1974).
Stritzker, B. et al., Z. Phys., 257, p. 1, (1972).
Harper J. M. E., Phys. Lett., 47A, p. 69, (1974).
Miller, R. J., et al., Phys. Rev. Lett., 34, p. 144, (1975).
Silverman, P. I. et al., Phys. Lett., 53A, p. 221, (1975).
Buckel, W. et al., Phys. Lett., 43A, p. 403, (1973).
Stritzker, B., Z. Physik, 268, p. 261, (1974).
Baranowski B., "High Pressure and Low Temp. Physics", Plenum, NY, 1978, Edited by C. W. Chu and J. A. Wollam, p. 43.
Standish W. J. et al., "Superconductivity and Hydrogen Depth Profiles in Electrolytically Charged Cu-Implanted Pd", Int. Symposium on Electronic Structure and Properties, Oral Public Comm., Mar. 4, 1982.
Scholz W. W. et al., "Depth Profiles of H in Electrolytically Charged Cu-Implanted Pd Superconductors", Am. Phy. Soc., Oral Comm., Mar. 1982.
Standish, J. et al., "Nuclear Reaction Analysis of H in Pd", Am. Phy. Soc., Oral Comm., Mar. 1982.
Leiberich, A. et al., "Superconductivity in H-Charged Cu-Implanted Pd", Phys. Lett., 87A, pp. 57-60, Dec. 21, 1981.
Leiberich, A. et al., "Superconductivity in Hydrogen Charged Copper Implanted Palladium", Tech Report, ARLCB-TR-81045 (ARRADIUM), Dec. 1981.
Scholz, W. W. et al., "Superconductivity in H-Charged Cu-Implanted Pd", Phy. Lett., 87A, p. 57-60, 1981, Oral Comm.
Scholz, W. W. et al., "Study of H-Distribution in Superconducting Pd Alloy Hydrides by Ion Beam Technique", Private Comm., Jun. 18, 1981, U.S. Army Symposium on High Pressure Phenomena, Rens., NY.

Primary Examiner—L. Dewayne Rutledge
Assistant Examiner—Christopher W. Brody
Attorney, Agent, or Firm—F. Wesley Turner

[57] ABSTRACT

A superconducting type II composite palladium alloy hydride material having a region containing a contiguous surface comprising a palladium alloy-palladium region wherein at least a portion of the alloy region contains hydrogen and at least a portion of the palladium region contains hydrogen.

19 Claims, 4 Drawing Figures

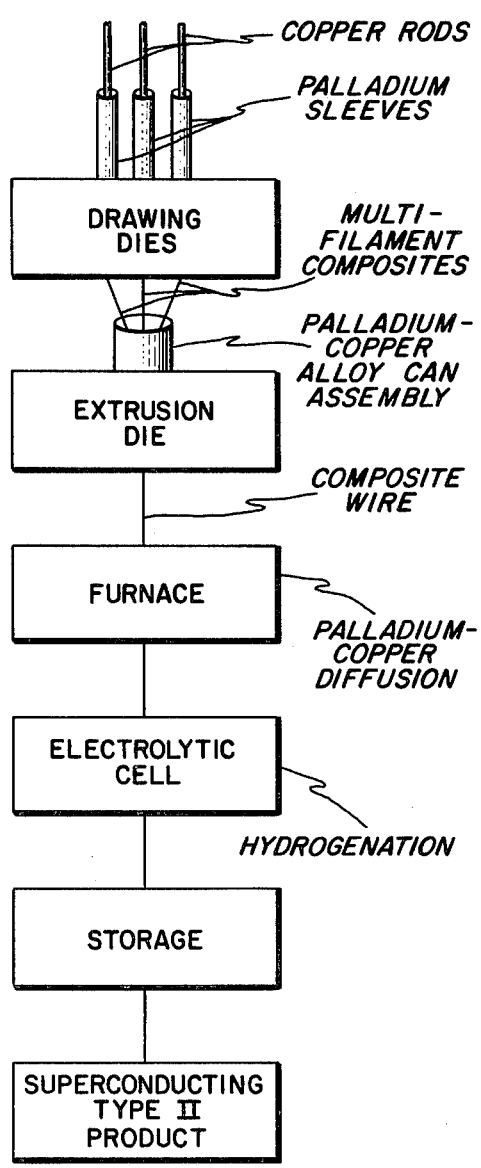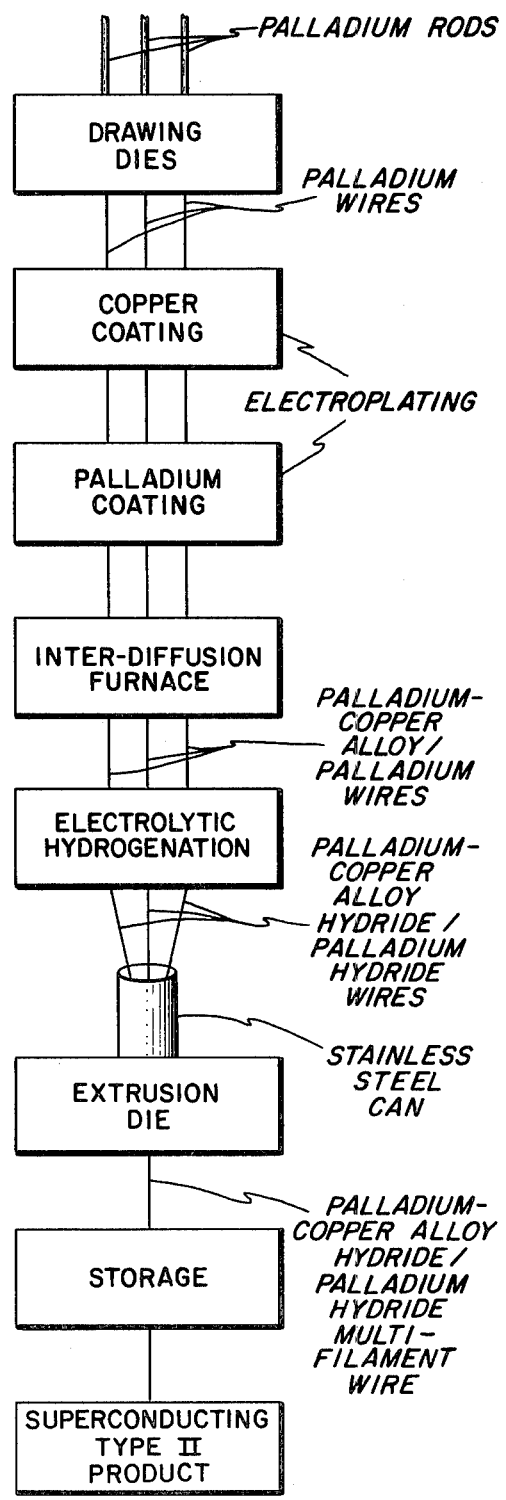

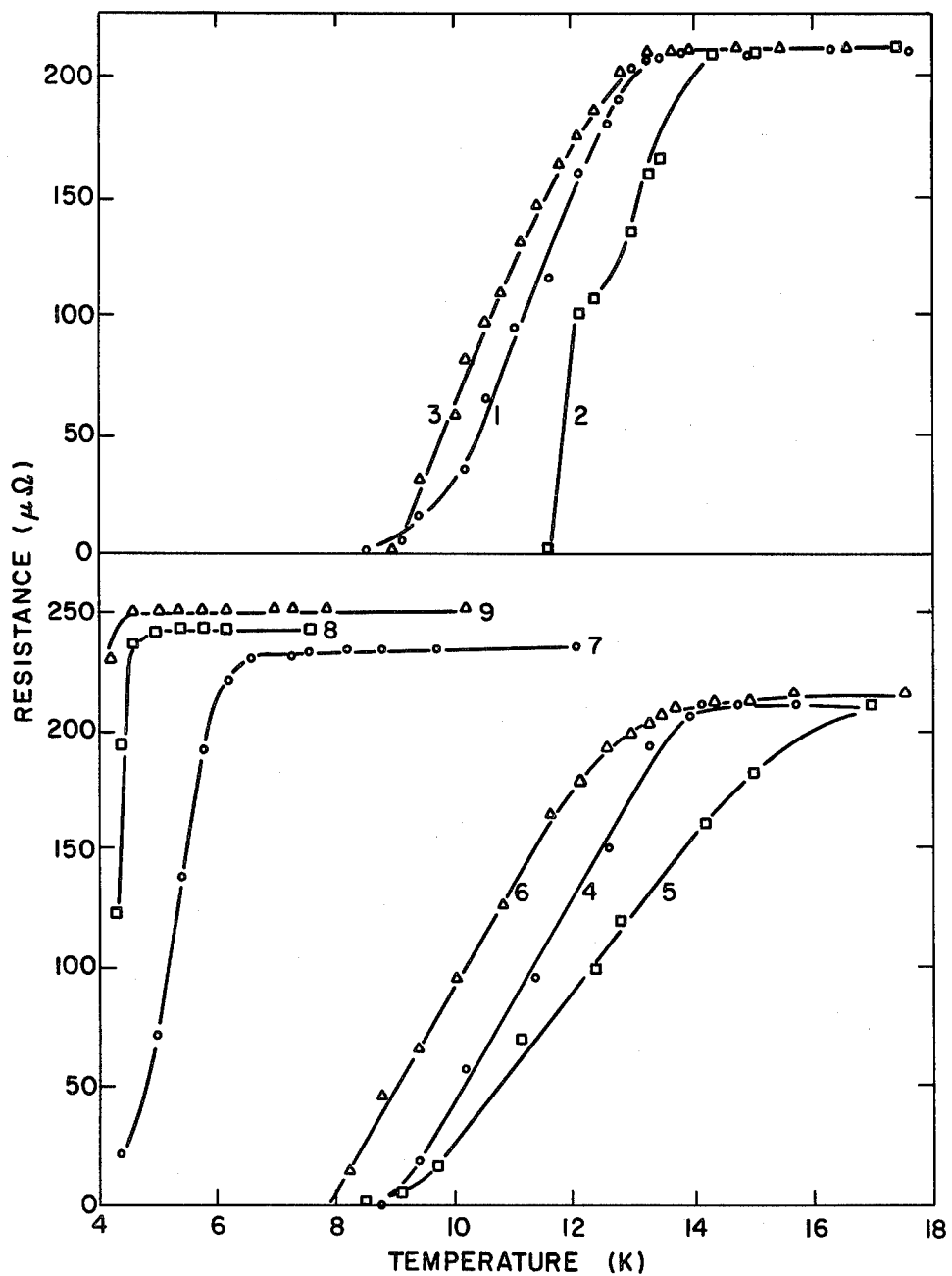

FIG. 3

SUPERCONDUCTING TRANSITIONS MEASURED ON A Cu-IMPLANTED Pd SAMPLE IMMEDIATELY AFTER ELECTROLYSIS AT DRY ICE TEMPERATURE AND TRANSFER TO THE LIQUID HELIUM BATH (1). TRANSITION CURVES MEASURED AFTER LETTING THE SAMPLE WARM-UP TO 113K AND 143K AND QUICKLY COOLING IT AGAIN ARE LABELED (2) AND (3), RESPECTIVELY. TRANSITION CURVES MEASURED AFTER WARM-UP TO 193K, 203K, 213K, 253K, 263K, AND 273K ARE LABELED (4)-(9), RESPECTIVELY.

H PROFILES MEASURED AT 77K ON A Cu-IMPLANTED Pd SAMPLE. (a) IMMEDIATELY AFTER ELECTROLYSIS (DASHED LINE) AND AFTER WARM-UP TO 113K (SOLID LINE). PROFILES LABELED (b)-(f) WERE MEASURED AFTER WARM-UP TO 143K, 178K, 203K, 233K, AND 273K RESPECTIVELY.

SUPERCONDUCTING TYPE II PALLADIUM ALLOY HYDRIDE-PALLADIUM HYDRIDE COMPOSITES

BACKGROUND OF THE INVENTION

1. Field of the Invention

This invention relates to superconducting type II palladium alloy hydride compositions and to superconducting electrical devices containing these materials.

2. Description of the Prior Act

The major superconducting type II materials of interest exhibit critical temperature $T_c$ values greater than about nine degrees kelvin (9° K.), upper critical field strength $H_c$ values greater than about 8 teslas (8T), and critical current density ($J_c$) values greater than about 10,000 amperes per square centimeter ($10^4$ amps./cm.$^2$).

Two classes of materials—inherently brittle niobium-tin ($Nb_3Sn$) compounds described, e.g., by Buehler et al in U.S. Pat. No. 3,124,455, and ductile niobium-titanium ($Nb_{0.40}Ti_{0.60}$) alloys described, e.g. by Matthias in U.S. Pat. No. 3,167,692—are generally employed as superconducting materials in composite form with normally conducting low resistance metals in high-performance superconducting magnets and/or other electrical devices requiring high current density while immersed in high magnetic fields. These superconducting materials in film, filament, strand or wire forms are embedded in a normally conducting matrix material such as copper, in order to protect the electrical device in the event of entry of the $Nb_3Sn$ or $Nb_{0.40}Ti_{0.60}$ material into a normal conducting high resistance state. To further protect these devices from the effects associated with a normal resistance state at critical current densities various complex manufacturing techniques, e.g. those described by Shattes et al U.S. Pat. No. 3,710,000, are employed in the fabrication of multifilamentary superconducting type II alloy and compound composites. These multifilament composite materials reduce the risk of deleterious heat spike effects caused by flux jumps, conductor motion, and screening currents induced with internal field changes. Superconducting niobium-titanium alloy filament diameters, e.g. about 10 micrometers, can be used to reduce the effects of dynamic losses associated with electrical devices experiencing screening-current rapid field changes. Eddy current loss effects are minimized by twisting and transposing superconducting filaments embedded in copper cells and by isolating these cells from other cells by thin copper-nickel insulating walls.

Manufacturing techniques associated with the fabrication of fine filamentary superconducting structures using niobium-tin and related A15 compounds are more complex than the manufacturing procedures associated with the use of niobium-titanium alloys. Illustratively niobium-tin conductors are prepared by compacting mixtures of niobium and tin powders inside a niobium tube with subsequent drawing of the tube into a length of wire. The niobium-tin compound is then formed by heat treatment only after the wire has been installed in the electrical device so that the effects of flexing and bending are minimized in the use of these extremely brittle compounds. Wire drawing of a pure niobium metal rod embedded in a matrix of bronze (an alloy of copper and tin) to final size with subsequent heating of the wire causing some of the tin to migrate from the bronze into the niobium where it reacts to form the desired niobium-tin superconductor is another useful fabrication method. However, notwithstanding these improved manufacturing techniques the highly brittle nature of the resulting niobium-tin superconductors continues to limit their use even though their high critical temperature $T_c$ of about 18° K. characteristics reduce refrigeration costs associated with cryogenic superconducting systems.

The palladium alloy hydride superconducting materials described herein can be manufactured in the form of ductile films, fibers, strands, and wires that exhibit critical current density $J_c$, comparable critical field strength $H_c$ or comparable critical magnet induction $B_c$, respectively, and critical temperature $T_c$ characteristics generally heretofore only associated with inherently brittle niobium-tin ($Nb_3Sn$) type A15 superconducting materials. The palladium alloy hydride materials are especially useful in the manufacture of electrical devices which require high $J_c$ critical current density and/or high critical field strength $H_c$ and high critical temperatures $T_c$ including for example, superconducting power transmission cables, high horsepower superconducting direct current motors and generators—especially homopolar type machines, alternators with superconducting rotors, superconducting magnets used for the storage of electrical power, "SADDLE" type magnets used in magnetohydrodynamic (MHD) power generators as well as toroidal magnets useful in the generation of power by thermonuclear fusion reactors.

SUMMARY OF THE INVENTION

This invention comprises a new superconducting type II palladium alloy hydride-palladium hydride composition, a process for the preparation of the new superconducting material, and a superconducting electrical device which employs this new material.

The new superconducting (SC) type II palladium alloy hydride material is defined herein as a metal composite having a region containing a contiguous surface comprising a palladium alloy-palladium region wherein at least a portion of the alloy region contains hydrogen and at least a portion of the palladium region contains hydrogen.

In a preferred embodiment the superconducting type II material contains a region wherein the hydrogen content of at least a portion of the alloy is greater than about one atom of hydrogen per atom of alloy.

In another preferred embodiment the superconducting type II material contains a region wherein the $T_c$ of at least a portion of a palladium alloy hydride region is equal to or greater than the $T_c$ of at least a portion of a palladium hydride region.

The palladium alloy hydride portion of the composite is described herein by the formula $(Pd_xM_{1-x})_y H_{1-y}$ where x is a number greater than zero and less than one, y is a number greater than zero and less than one, and M represents a metal. The palladium hydride portion of the composite is described herein by the formula $Pd_yH_{1-y}$ where y is a number greater than zero and less than 1.0.

In a more preferred embodiment a superconducting type II composite comprises a material characterized by a critical temperature $T_c$ greater than about 9° K. comprising a palladium alloy hydride region represented by the formula $HPd_xM_{1-x}$ wherein x is a number greater than zero and less than one, at least a portion of said alloy hydride contains a region wherein the atom ratio of H to $Pd_xM_{1-x}$ is a number greater than about 1.0, and M is a noble metal selected from copper, silver or gold, and a metal hydride region represented by the formula $Pd_yH_{1-y}$ wherein y is a number greater than zero and less than 1.0, subject to the proviso that a common boundary separates at least one alloy hydride region from at least one metal hydride region.

The process comprises the hydrogenation of a palladium composite having a contiguous palladium alloy-palladium substrate. The palladium alloy is described herein by the formula $Pd_xM_{1-x}$, where x and M are as defined hereinbefore, and palladium is described herein by the symbol Pd. In a preferred embodiment M is selected from copper, silver or gold.

The SC type II electrical device comprises a device which contains a palladium alloy hydride-palladium hydride electric current carrying conductor that exhibits no resistance to the flow of electricity. A particularly useful electrical device within the scope of this invention includes a SC magnet which contains means for the introduction of a current of sufficient magnitude that a magnetic field is produced within the palladium alloy hydride current carrying region under cryogenic conditions at temperatures at least as low as the critical temperature $T_c$ of the palladium alloy hydride region.

The palladium alloy hydride-palladium hydride SC type II composites can be formed by hydrogenating film, foils, filaments, strands, wires and rods having one or more opposing continuous palladium alloy-palladium surfaces substantially across an entire length of a surface region.

BRIEF DESCRIPTION OF THE DRAWINGS

FIG. 1 describes a method of forming the palladium alloy hydride-palladium hydride superconducting type II composites of this invention.

FIG. 2 describes an alternate method of forming the superconducting type II alloy composites of this invention.

FIG. 3 describes a series of temperature transition curves (1-6) showing critical temperatures $T_c$ of superconducting type II palladium alloy hydride compositions of this invention having $T_c$ critical temperature values greater than about 9° K.

DETAILED DESCRIPTION

Figure 4:
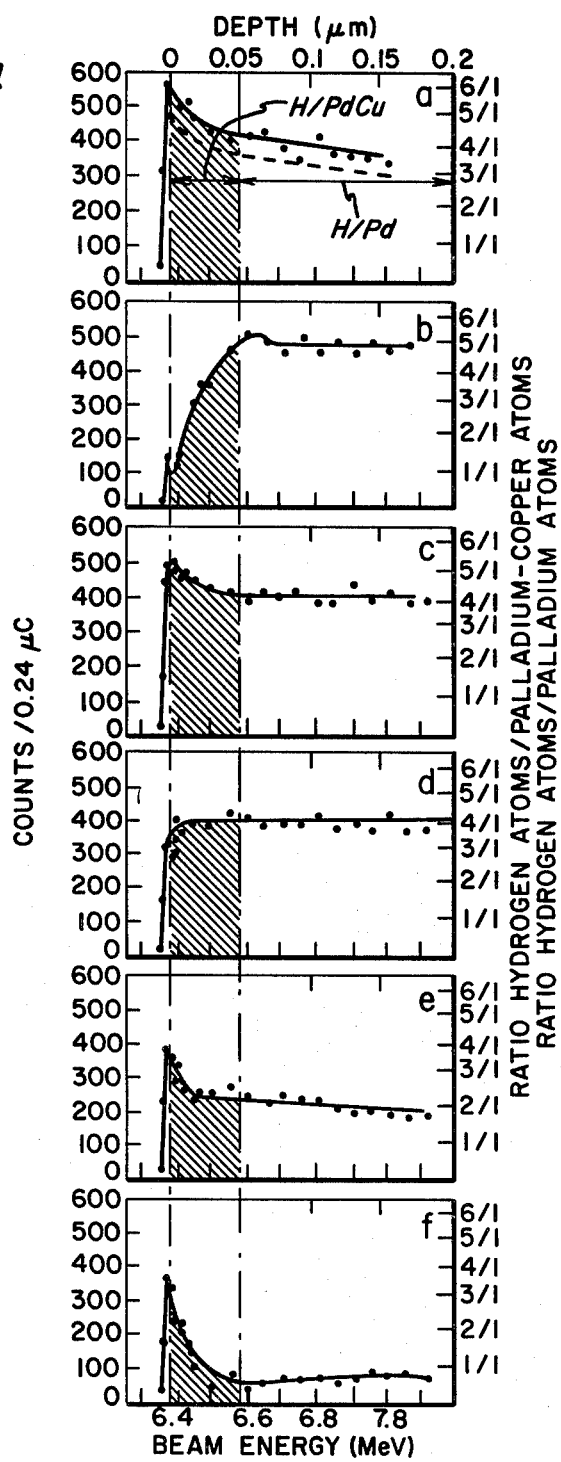
FIG. 4 describes a series of hydrogen concentration and depth distribution profiles measured by nuclear reaction analysis at 77° K. on superconducting type II palladium alloy hydride compositions of this invention.

A process that can be used in the preparation of the superconducting type II composites of this invention, illustrated by FIG. 1, is described hereinafter. (1) Copper rods are inserted into palladium sleeves; (2) the resulting copper palladium rod-sleeve assemblies are cold drawn through a reducing die or a series of reducing dies to reduce the cross-sectional area of the palladium-copper assembly to form multi-filament composites; (3) the multi-filament composites are then inserted into a palladium-copper alloy extrusion can assembly; (4) the assembly is extruded through an extrusion die or a series of extrusion dies to further reduce the palladium-copper composites to their approximate final multi-filament diameters; (5) this extruded assembly is then heated at elevated temperatures to diffuse at least a portion of the palladium sleeve coating into a minor portion of the copper core of each filament; (6) the interdiffused copper-palladium composites are then hydrogenated by passing hydrogen into the wire composite by means of an electrolytic cell operating at a temperature below about 225° K. while the palladium-copper wire composite acts as the cathode during the electrolysis process; and then (7) stored at temperatures below about 225° K.

The copper palladium sleeves described with reference to FIG. 1 above can also comprise additional alternating sleeves of palladium and copper. The palladium or copper core-sleeve combinations can be formed by any well known metallurgical technique including cladding, co-extrusion of copper and palladium, casting of palladium or copper composite, metal sputtering, electron beam deposition, plasma spraying, chemical vapor deposition, ion beam mixing, ion implantation, etc. including combinations thereof. The drawing-extrusion cross-section area reduction steps in the formation of composite wire can be repeated to provide superconducting type II wire having an outside diameter within the range of 10 to 25 mils and containing as many as $2 \times 10^6$ individual superconducting type II composite filaments. Each individual filament may comprise a diameter of 10,000 to 100,000 Angstroms containing alternating layers of palladium and copper which may be as thin as 200–2,000 Angstroms in the pure palladium or pure copper regions.

With reference to FIG. 2 an alternate process sequence is described that can be followed in preparation of the superconducting type II composites of this invention. This process comprises the following steps: (1) palladium rods are cold drawn to produce a reduced cross sectional rod area to form intermediate diameter palladium wire; (2) the palladium wire is then passed through a copper coating electroplating bath; and then (3) passed through a palladium coating electroplating bath in order to form composites having alternating layers of palladium and copper; (4) the resulting palladium and copper alternating coatings are heated to elevated Pd-Cu interdiffusion temperatures to provide palladium-copper alloy/palladium interfacing opposing boundary regions within the wire composites; (5) the resulting wire is then electrolytically hydrogenated in an electrolytic cell to form palladium-copper hydride alloy/palladium hydride medium diameter composites; (6) the hydrogenated palladium-copper alloy/palladium hydride medium diameter wire is then assembled in a stainless steel extrusion container and cold drawn at temperatures less than about 225° K. in a refrigerated extrusion die or a series thereof in order to reduce the cross sectional area of the hydrogenated composite to the appropriate wire diameter including the appropriate multi-filament composite diameters; and (7) stored at temperatures below about 225° K. in order to optimize maintenance of the hydrogen content of the wire composites at the levels essential to their critical temperature $T_c$ properties. Optionally and in contrast to the processes described in FIG. 1 and FIG. 2 palladium alloy/palladium wire substrates can be hydrogenated within superconducting articles of manufacture such as cables, motors, generators, magnets, etc. by passing hydrogen into normally conducting palladium alloy/palladium wire regions (a) by means of current carrying low temperature electrolyte passage-ways in communication with palladium alloy/palladium substrates as well as a direct current source, or (b) by means of low temperature hydrogen pressurized passageways in direct communication with palladium alloy/palladium substrates, to form in-situ palladium alloy hydride/palladium hydride superconducting type II conductors having the enhanced hydrogen content associated with the electrical conductors of this invention.

Although for conciseness wire forming process illustrations have been limited to FIG. 1 and FIG. 2 those skilled in the art will readily recognize that the wire forming processes could also have included an endless number of plating, sputtering, drawing, annealing, rolling, electroplating, hot dipping, hot drawing, cold drawing, extrusion, ion beam mixing, etc. process steps to form the palladium alloy/palladium substrates which are characterized after hydrogenation by the superconducting type II properties associated with the composites of this invention.

The critical temperatures $T_c$ properties illustrated by FIG. 3 and the associated hydrogen concentration profiles illustrated by FIG. 4 obtained by a low temperature hydrogenation of palladium alloy-palladium substrates having a common boundary separating the palladium alloy-palladium regions are further described in combination with the Examples which follow.

EXAMPLE 1

Singly charged copper ions were implanted to a dose of $8 \times 10^{16}$ ions/cm$^2$ at 100 keV into a 25-micron thick palladium foil. The foil had a nominal purity (analysis by flame spectroscopy) of 99.99%.

A maximum copper concentration (atom fraction) of $0.23 \pm 0.04$, ($Pd_{0.77}Cu_{0.23}$), at the surface of the foil was estimated from the inverse of the copper self-sputtering yield $S_{Cu} = 4.3 \pm 0.8$. The calculated total remaining copper implant dose was $3.7 \times 10^{16}$ atoms/cm$^2$. The copper-implanted region was approximately 0.05 microns deep.

Four leads were spotwelded onto the copper-implanted Pd foil in order to make resistance measurements. The Cu-implanted Pd foil sample was epoxied onto a hollow Plexiglas tube. The tube contained the electrical leads, and a thermocouple for measuring the sample temperature. Electrolytic charging of the Cu-implanted Pd foil with hydrogen was accomplished in an acetone-dry ice bath at a temperature of 200° K. using a solution of 38% HCl in methanol as the electrolyte. The hydrogen charged copper-implanted Pd foil after removal from the electrolyte was immediately placed in liquid nitrogen and subsequently transferred to liquid helium dewar. A temperature control of about ±0.5° K. was maintained.

Measurement of the series of superconducting transition temperature curves of the hydrogenated Cu-implanted Pd foil described in FIG. 3, was carried out using a four-probe direct current resistance technique and employing currents of 40 milliamps (mA) to 2 amps (A). A calibrated thermocouple was used to measure stable temperatures. The $T_c$ temperature described hereafter is the average of the temperatures at 10% and 90% of the normal state resistance of the hydrogenated Cu-implanted Pd foil. Following initial measurement of the superconducting transition curve of the hydrogenated Cu-implanted Pd foil, the sample was sequentially slowly warmed up to increasingly higher temperatures, quickly cooled in the liquid helium bath and once again a transition temperature curve was measured. The warming procedure involved withdrawing the hydrogenated Cu-implanted Pd foil from the liquid helium bath until it reached a given temperature, and subsequently immersing the foil in the liquid helium bath in order to once again measure the critical temperature of the hydrogenated Cu-implanted Pd foil.

FIG. 3 shows measured transition curves. The hydrogenated Cu-implanted Pd foil exhibited an initial $T_c$ value of 11.1° K. (curve No. 1); a $T_c$ value of 12.4° K. (curve No. 2) after the foil was warmed to 113° K. Subsequent warmup to 143° K. reduced the $T_c$ value to 10.9° K. (curve No. 3). After warming the foil to 203° K. the $T_c$ value increased again to 12.4° K. (curve No. 5). Subsequent warmup steps above 203° K. all produced a decrease in $T_c$ values (curves Nos. 6–9). The normal state resistance of the hydrogenated Cu-implanted Pd foil above onset temperature of the superconducting transition remains fairly constant for warmup steps up to 213° K. (curve No. 6) indicating at most a small loss of hydrogen from the hydrogenated Cu-implanted Pd foil up to 213° K. temperature. Above 213° K., hydrogen is released from the hydrogenated Cu-implanted Pd foil as indicated by the increase in the normal state resistance (curve Nos. 7–9). After warmup to 273° K. (0° C.) the beginning of a superconducting transition is just visible at 4.2° K. (curve No. 9).

FIG. 3 illustrates the ability of this inventive alloy Pd composite described herein to retain and to exhibit high $T_c$ superconductivity even after experiencing elevated temperatures.

In FIG. 3 a current of 1 amp was passed through the foil while the transition curves were measured. This result indicates that a current density ($J_c$) of at least the order of $5 \times 10^5$ amps per square centimeter was being conducted by the hydrogenated Cu-implant region of the palladium foil at $T_c$ values greater than 9° K.

A pure palladium foil electrolytically charged with hydrogen in an acetone-dry ice mixture at a temperature of about 200° K. using a solution containing 38% HCl in methanol as the electrolyte until the palladium foil is saturated with hydrogen exhibits a $T_c$ of 9° K. Accordingly the elevated $T_c$ values observed for the hydrogenated copper-implanted palladium foil composite exhibiting critical temperatures above about 9° K. are due to the occurrence of superconductivity above 9° K. in the hydrogenated Cu-implanted Pd region of the foil.

Changes in critical temperature $T_c$ characteristics of the hydrogenated Cu-implanted palladium foil are caused by changes in the hydrogen concentration in the Cu-implant region of the foil since there are no other atomic species present within the implant region which are sufficiently mobile below 273° K. to account for changes in the elevated $T_c$ values and the transition curves.

The existence of a palladium copper alloy region interfacing and opposing a pure palladium surface region in the copper-implanted palladium foil is essential to optimum retention of hydrogen under electrolytic conditions at temperatures within the range of from about 175° K. to about 225° K. in both the copper palladium alloy and palladium regions of the film. This effect is even more pronounced when amounts in excess of one atom of hydrogen per atom of $Pd_xM_{1-x}$ in the alloy region, and amounts in excess of one atom of hydrogen per atom of Pd in the pure Pd region are desired.

EXAMPLE 2

A high purity palladium foil was implanted with copper ions as described in Example 1. The maximum copper concentration atom fraction of $0.23 \pm 0.04$, ($Pd_{0.77}Cu_{0.23}$), at the surface of the foil decreased to zero, ($Pd_{1.00}Cu_{0.00}$), at a distance of approximately 0.05 microns. The sample was electrolytically hydrogenated in an acetone-dry ice bath at about 200° K. and subsequently cooled to liquid nitrogen temperature at 77° K.

for the purpose of measuring the hydrogen profile across hydrogenated copper-implanted palladium alloy regions and pure palladium regions of the foil.

A series of hydrogen concentration and penetration profiles, described in FIG. 4, were measured across the hydrogenated Cu-implanted palladium foil alloy region into the pure Pd region of the foil to a depth of 0.2 microns by nuclear reaction analysis (NRA) initially at 77° K. and after thermal cycling to elevated temperatures with subsequent return to 77° K. for further NRA.

The hydrogen profiling was conducted by nuclear reaction analysis which measured isolated high-energy gamma rays emitted from the hydrogenated Cu-implanted Pd foil to a depth of about 0.2 microns. The reaction $^{15}N(^1H$, alpha gamma$)^{12}C$ was used i.e., $^{15}N+H\rightarrow ^{16}O^*\rightarrow ^4He+^{12}C^*\rightarrow ^{12}C+$gamma ray, (W. A. Lanford et al Appl. Phys. Lett. 28, 566 (1976)). This reaction has a narrow resonance at 6.4 MeV in the laboratory frame. The yield of characteristic 4.43 MeV gamma-rays was measured with a NaI detector. For concentration distributions that do not appreciably change over the half-width of the Lorentzian-shaped resonance, this yield is given by.

$$Y(E_B) = kQn(x)/(dE/dx). \quad (1)$$

In equation (1), Q is the number of incident $^{15}N$ ions, n(x) is the hydrogen concentration at depth x, (dE/dx) is the stopping power of the sample, and k is a constant characteristic of the experimental setup (including resonance parameters, detection efficiency and solid angle of the detector, and absorption of gamma-rays between the foil sample surface region and detector). The calibration constant k was determined experimentally using several targets of known hydrogen concentration, e.g. ice.

In equation (1) the $^{15}N$ beam energy $E_B$ is related to the depth x by $E_R = E_B - x$ (dE/dx), where $E_R$ is the resonance energy. By varying the bombarding energy, the hydrogen concentration with depth was determined. The depth resolution depends on the resonance width and $^{15}N$ beam energy spread through (dE/dx) and was estimated to be about 3 nm.

FIG. 4(a), (b), (c), (d), (e), (f), describes the hydrogen profiles series measured within the palladium copper alloy region (0–0.05 microns) and the pure palladium region (0.05–0.2 microns) and illustrates the surprisingly high ratios of hydrogen atoms to alloy atoms and pure palladium atoms, i.e., ratios in excess of 1/1. As illustrated by FIG. 4 the hydrogen atom to alloy atom ratios varied from about 4/1 to about 0.6/1 in the Cu-implant Pd region and also from about 4/1 to about 0.6/1 in the pure Pd region. High hydrogen concentration areas, especially those areas where the hydrogen to alloy or pure Pd concentration is 2/1 or 3/1 or higher define current carrying cross sectional areas of the foil which exhibit critical $T_c$ values greater than 9° K. and $J_c$ values greater than $10^6$ amps per square centimeter. FIG. 4 peak hydrogen values, i.e., 6/1 or 5/1 illustrated in FIG. 4(a) include the hydrogen counts associated with water adsorbed on the alloy surface at depths of 0.00 to approx. 0.005 microns.

A comparison of the FIG. 4 hydrogen concentration profile data with the superconducting transition curves of FIG. 3 illustrates that as the hydrogen content of the alloy region of the foil increases the probability of the foil exhibiting $T_c$ values in excess 9° K. also increases. Further comparison of FIG. 3 and FIG. 4 also illustrates that onset initial $T_c$ values as high as 16.5° K. are found in alloy-Pd composites having hydrogen to alloy-Pd ratios of at least about 3/1. The breadth of the transition curves in FIG. 3 is believed to be a result of the inhomogeniety of the copper-palladium alloy region associated with the ion implantation technique employed in the preparation of the sample described in Example 1.

As illustrated by FIG. 4(a), after a warmup of the foil to 113° K. the hydrogen profile showed an increase of high-energy gamma ray counts for the Cu-implant foil region and the pure Pd foil region. Warming the hydrogenated foil to 143° K. (FIG. 4b) produced a reduction in hydrogen concentration in the Cu-implant region and an increase in hydrogen concentration just beyond the Cu-implant alloy region i.e. the region just beyond the copper palladium alloy region and just within the pure palladium bulk metal region. The observed hydrogen profile closely traced the calculated Cu-implant alloy region profile. Further warming of the foil to 178° K. (FIG. 4c) replenished hydrogen in the Cu-implant alloy region and slightly reduced the concentration beyond the Cu-implant alloy region. Further warmup of the foil to 203° K. (FIG. 4d) affected only the Cu-implant alloy surface ($Pd_{0.77}Cu_{0.23}$) and near-surface hydrogen content, reducing the hydrogen count by about ¼. Warming to 233° K. (FIG. 4e) considerably reduced the hydrogen concentration in both the Cu-implant regions and the pure Pd substrate. This behavior continued upon warming the sample to 273° K. (FIG. 4f).

Comparison of FIG. 4 profiling data with the superconducting transition curves of FIG. 3 shows a strong correlation between hydrogen content in the Cu-implant region and $T_c$ values greater than 9° K. The fact that both the hydrogen and Cu distributions are depth-dependent may account for the broadness observed in some of the higher $T_c$ transition values (curves 1–6) of FIG. 3.

As employed herein alloy hydrides, metal hydrides, hydrogen atoms, hydrogenation, etc., generally employ and/or refer to hydrogen. However, the compositions, processes and/or devices described herein can also, optionally, employ hydrogen isotopes in atomic or molecular form wherein the hydrogen is present as "heavy hydrogen" $^2H$ also known as "deuterium", "light hydrogen" $^1H$ also known as "protium", or $^3H$ also known as "tritium".

We claim:

1. A composite material comprising a current carrying Superconducting Type II pathway having a critical temperature Tc greater than about 9 K. wherein said pathway consists essentially of a substantially contiguous and continuous palladium alloy hydride atom lattice in touch with a palladium hydride atom lattice.

2. A superconducting type II composite having a critical temperature $T_c$ comprising a metal composite having a palladium alloy hydride region represented by the formula $(Pd_xM_{1-x})_yH_{1-y}$ where x is a number greater than zero and less than one, y is a number greater than zero and less than one, and M is a metal, and a palladium hydride region represented by the formula $Pd_yH_{1-y}$ where y is a number greater than zero and less than one, subject to the proviso that (A) a substantially contiguous common boundary separates at least one said alloy hydride region from at least one said palladium hydride region, (B) the hydrogen content of at least a portion of the alloy is greater than about one atom of hydrogen per atom of alloy, and (C) and $T_c$ of at least a portion of a palladium alloy hydride region is equal to or greater than the $T_c$ of at least a portion of a palladium hydride region.

3. A superconducting type II composite having a critical temperature $T_c$ greater than about 9° K. comprising (a) at least a palladium alloy hydride region represented by the formula $HPd_xM_{1-x}$ wherein x is a number greater than zero and less than one, at least a portion of said alloy hydride contains a region wherein the atom ratio of H to $Pd_xM_{1-x}$ is a number greater than about 1.0, and M is a noble metal selected from copper, silver or gold, and (b) at least a metal hydride region represented by the formula $Pd_yH_{1-y}$ wherein y is a number greater than zero and less than 1.0, subject to the proviso that a common boundary separates at least one said alloy hydride region from at least one said metal hydride region.

4. A claim 3 composite wherein the palladium alloy is inhomogeneous.

5. A claim 3 composite wherein the palladium alloy is homogeneous.

6. A claim 3 superconducting type II composite wherein said ratio of H to $Pd_xM_{1-x}$ is a number greater than about 3.0.

7. An electrical conductor comprising said superconducting type II composite of claim 3.

8. A claim 3 electrical conductor wherein said conductor takes the form of a wire wherein said at least a palladium alloy hydride region and said at least a metal hydride region comprises an interfacing contiguous surface boundary along substantially the entire length of the said wire.

9. A claim 8 electrical conductor wherein said wire comprises a core comprising said alloy hydride region and a coating comprising said metal hydride region.

10. A claim 9 electrical conductor wherein said wire has a plurality of contiguous opposing alloy hydride-metal hydride surface along substantially the entire length of the said wire.

11. A claim 8 electrical conductor wherein said wire comprises a core comprising said metal hydride region and a coating comprising said alloy hydride region.

12. A claim 11 electrical conductor wherein said wire has a plurality of contiguous opposing alloy hydride-metal hydride surfaces along substantially the entire length of the said wire.

13. A claim 3 composite wherein the noble metal is copper.

14. A claim 13 composite wherein the palladium alloy is inhomogeneous.

15. A claim 14 composite wherein y is equal to or greater than 0.33.

16. A claim 15 composite wherein y is equal to or greater than 0.25.

17. A claim 1 composite wherein the alloy is a palladium-copper alloy.

18. A claim 17 composite wherein the alloy is inhomogeneous.

19. An electrical conductor comprising said superconducting type II composite of claim 18.

* * * * *